(12) United States Patent
Mauder et al.

(10) Patent No.: US 10,371,752 B2
(45) Date of Patent: Aug. 6, 2019

(54) SWITCH DEVICE

(71) Applicant: Infineon Technologies Austria AG, Villach (AT)

(72) Inventors: Anton Mauder, Kolbermoor (DE); Kay Krupka, Wedemark (DE); Jens Barrenscheen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 377 days.

(21) Appl. No.: 14/694,242

(22) Filed: Apr. 23, 2015

(65) Prior Publication Data
US 2016/0313402 A1    Oct. 27, 2016

(51) Int. Cl.
*G01R 31/327*    (2006.01)
*G01R 31/26*    (2014.01)

(52) U.S. Cl.
CPC ...... *G01R 31/3277* (2013.01); *G01R 31/2621* (2013.01)

(58) Field of Classification Search
CPC .................................................. G01R 31/3277
See application file for complete search history.

(56) References Cited

U.S. PATENT DOCUMENTS

| | | | | |
|---|---|---|---|---|
| 4,713,720 A * | 12/1987 | Rogers | ............... | H03K 17/0826 327/75 |
| 4,918,566 A * | 4/1990 | Brodsky | ................ | H01H 9/167 307/34 |
| 5,926,012 A * | 7/1999 | Takizawa | ............ | H03K 17/0828 323/284 |
| 2009/0060513 A1* | 3/2009 | Dinca | .................. | H04B 10/802 398/106 |
| 2011/0205672 A1* | 8/2011 | Sakai | .................... | B62D 5/0487 361/18 |
| 2012/0212159 A1* | 8/2012 | Kitamoto | ............. | B62D 5/0487 318/139 |
| 2013/0187656 A1* | 7/2013 | Barrenscheen | ........ | H03K 17/28 324/415 |

FOREIGN PATENT DOCUMENTS

| | | |
|---|---|---|
| CN | 1153413 A | 7/1997 |
| CN | 1988385 A | 6/2007 |
| CN | 102545739 A | 7/2012 |
| CN | 103219980 A | 7/2013 |
| DE | 4026398 A1 | 2/1991 |

\* cited by examiner

*Primary Examiner* — Daniel R Miller
(74) *Attorney, Agent, or Firm* — Murphy, Bilak & Homiller, PLLC

(57) ABSTRACT

According to an embodiment of a switch device, the switch device includes a first switch, a second switch and an evaluation circuit. The evaluation circuit is configured to evaluate a temporal behavior of a node between the first switch and the second switch to detect a possible fault condition of at least one of the first switch or the second switch. A corresponding fault detection method for a switch device having a first switch and a second switch is also provided.

18 Claims, 4 Drawing Sheets

SWITCH DEVICE

TECHNICAL FIELD

The present application relates to switch devices and associated methods.

BACKGROUND

Switch devices are generally used to selectively couple two terminals of the switch device electrically. In this way, for example power switch devices may be used to couple a load selectively to a supply voltage, for example by coupling the supply voltage with a first terminal of the switch device and coupling the load with a second terminal of the switch device.

For some applications, conventionally mechanical switches are used, for example for high-voltage applications. However, with increasing capabilities of semiconductor switches (for example power transistors), it becomes increasingly desirable to also use semiconductor switches in applications where conventionally mechanical switches have been used.

For some applications, for example safety-relevant applications, it is desirable or even required to be able to obtain information regarding the state of the switch. For example, it may be desirable or required to be able to obtain information if the switch is correctly open or closed by a measurement independent from a control signal controlling the switch.

In mechanical switches, such a sensing of the state of the switch may be implemented by using parallel sense contacts with low power consumption which are operated in parallel to the actual contacts of the mechanical switch. However, this concept may not easily be transferred to semiconductor switches.

SUMMARY

According to an embodiment of a switch device, the switch device comprises a first switch, a second switch and an evaluation circuit. The evaluation circuit is configured to evaluate a temporal behavior of a node between the first switch and the second switch to detect a possible fault condition of at least one of the first switch or the second switch.

According to an embodiment of a fault detection method for a switch device having a first switch and a second switch, the method comprises: evaluating a temporal behavior of a node between the first and second switches; and determining a possible fault condition of at least one of the first switch or the second switch based on the temporal behavior.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
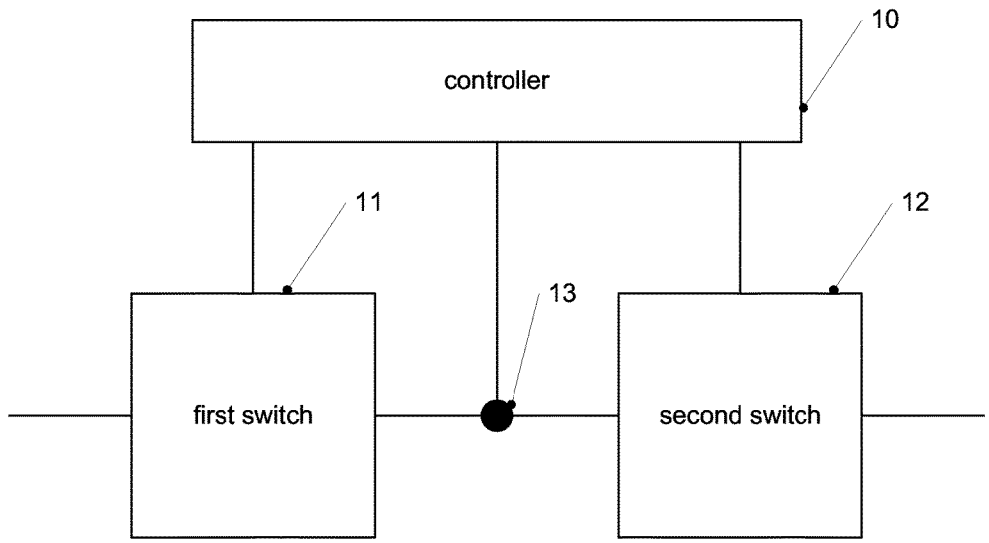
FIG. 1 is a block diagram illustrating a switch device according to an embodiment.

In the following, various embodiments will be described in detail with reference to the attached drawings. It is to be noted that these embodiments serve as illustrative examples only are not to be construed as limiting the scope of the present application. For example, while an embodiment may be described as comprising a plurality of features or elements, this serves illustration purposes only, and in other embodiments some of these features or elements may be omitted and/or replaced by alternative features or elements. Furthermore, in some embodiments additional features or elements in addition to those explicitly described or shown in the drawings may be provided without departing from the scope of the present application. Features or elements from different embodiments may be combined with each other to form further embodiments. Modifications and variations described with respect to one of the embodiments may also be applicable to other embodiments.

Any connections or couplings, in particular electrical connections or couplings, shown in the drawings or described herein may be implemented as direct connections or couplings, i.e. as connections or couplings without intervening elements, or as indirect connections or couplings, i.e. connections or couplings with one or more intervening elements, as long as the general function of the connection or coupling, for example to transmit a certain kind of information or signal, is essentially maintained. Connections or couplings may be implemented as wire-based connections or couplings or as wireless connections or couplings, or mixtures thereof.

Generally, in the context of the application switches may be described as comprising one or more control terminals and two or more load terminals. An opening and closing of the switch may be controlled by applying one or more signals to at least one of the one or more control terminals. When the switch is closed, it provides (in a fault-free state) a low-ohmic connection between at least two of its load terminals, such that current may flow between the load terminals. When the switch is opened, the power switch exhibits a blocking behavior between its load terminals, i.e. it is high-ohmic, such that essentially no current may flow between the load terminals. It should be noted that in real-life implementations even in the open state some (generally undesired) currents like leakage currents may flow. Such leakage currents are usually some orders of magnitudes lower than currents flowing in a closed state of the switch.

For example, in an application as a power switch, one load terminal may be coupled to a load, and another load terminal may be coupled to a supply voltage, to selectively couple the load with the supply voltage via the switch. In the context of the present application, the closed state is also referred to as an on-state of the switch, and the open state is also referred to as off-state.

In some embodiments, switches may be implemented using a transistor, for example a field-effect transistor like a MOS transistor. In this case, the load terminals may for example correspond to source and drain terminals of the transistor, and a control terminal may correspond to a gate terminal. In other embodiments, switches may be implemented using bipolar transistors. In such a case, load terminals may for example correspond to emitter and collector terminals, and a control terminal may correspond to a base terminal.

In some embodiments, a switch device comprising at least a first switch and a second switch may be provided. A state of at least one of the first switch and the second switch may be determined by monitoring a voltage at a node between the first switch and the second switch when the first switch and the second switch are open, for example a temporal behavior of the voltage at the node.

Turning now to the figures, FIG. 1 illustrates a block diagram of a device according to an embodiment.

The device of FIG. 1 comprises a first switch 11 and a second switch 12. At least one of first switch 11 and second switch 12 may be a semiconductor switch, for example a transistor-based switch. In other embodiments, for example first switch 11 may be a semiconductor switch and second switch 12 may be a mechanical switch. In other embodiments, both switches 11, 12 may be semiconductor switches, or both switches 11, 12 may be mechanical switches While first switch 11 and second switch 12 in the embodiment of FIG. 1 are coupled directly, i.e. without intervening elements, in series, in other embodiments one or more further elements, for example a load, may be provided between first switch 11 and second switch 12. Opening and closing of first switch 11 and second switch 12 in the embodiment of FIG. 1 are controlled by a controller 10 and may for example be used to selectively couple a load to a power source, but is not limited thereto.

Controller 10 furthermore is coupled to a node 13 between first switch 11 and second switch 12. In some instances, starting from a closed state controller 10 may for example control first switch 11 to open, and shortly thereafter control second switch 12 to open. When both first and second switches 11, 12 are open, controller 10 may monitor a voltage at node 13, in particular a temporal behavior of a voltage at node 13. For example, a rate or speed of change of a voltage at node 13 may give information about leakage currents across first switch 11 and/or second switch 12, i.e. give information if first switch 11 and/or second switch 12 is correctly opened and/or operates correctly in an open state, i.e. exhibits a low leakage current and provides a high-ohmic resistance.

More detailed examples will be discussed later.

While in FIG. 1 first switch 11 and second switch 12 are controlled by controller 10 and also the evaluation of the voltage at node 13 is performed by controller 10, this is not to be construed as limiting, and different circuits or entities of controller 10 may serve these different functions. In other words, providing a block "controller" is not to be construed as indicating that this controller has to be implemented as a single entity for all functions it performs.

Figure 2:
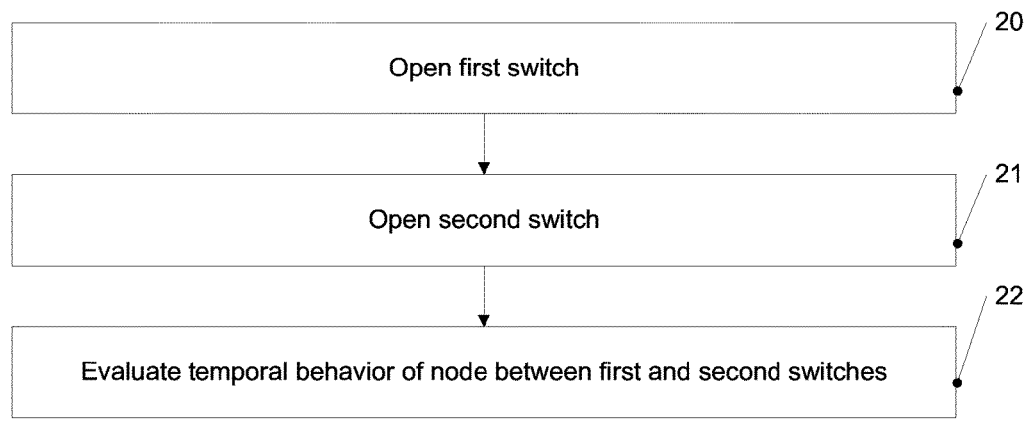
FIG. 2 is a flowchart illustrating a method according to an embodiment.

FIG. 2 is a flowchart illustrating a method according to an embodiment. The method of FIG. 1 may be implemented in the switch device of FIG. 1 or the switch devices described later with reference to FIGS. 3 to 5, but may also be implemented in other devices and environments.

At 20, the method comprises opening a first switch which was previously closed. The first switch may be a semiconductor switch, but is not limited thereto.

At 21, the method comprises opening a second switch which was previously closed. In some embodiments, the second switch may be a mechanical switch, but is not limited thereto. The opening at 21 may be performed essentially simultaneously or shortly after the opening at 20 in some embodiments. In other embodiments, at 20 and 21 previously opened switches may be closed.

At 22 a temporal behavior of a node between the first and second switches, for example a temporal behavior of a voltage at the node, is evaluated. For example, a rate or speed with which the voltage approximates a stationary value or a reference value may be evaluated in some embodiments. Based on the evaluation, in some embodiments information regarding correct opening of the switch and/or information regarding leakage currents may be obtained, which will be explained later in some more detail.

Figure 3:
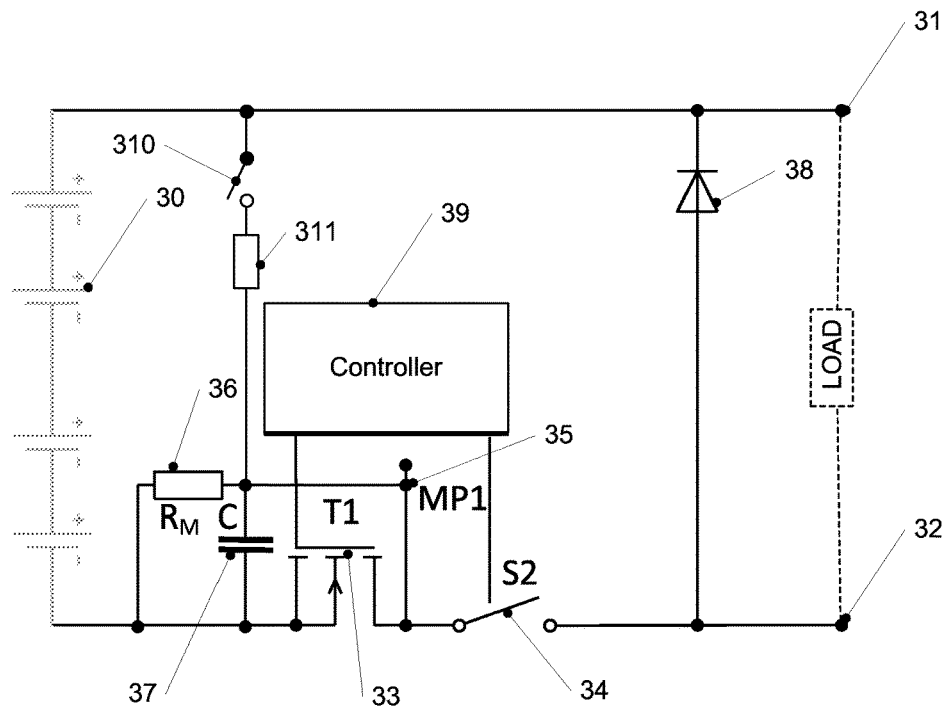
FIG. 3 illustrates a switch device according to an embodiment.

FIG. 3 illustrates a switch device according to an embodiment comprising some additional circuitry. In the embodiment of FIG. 3, the switch device comprises a semiconductor switch 33, for example implemented as a transistor also labeled T1 in FIG. 3. Semiconductor switch 33 in the embodiment shown is an enhancement type n-channel MOSFET. However, other semiconductor switches, for example other transistor types, may also be used, such as a depletion type field-effect transistor, a p-channel transistor, an insulated-gate bipolar transistor or any other electronic power switch may also be used in other embodiments.

Furthermore, the switch device of the embodiment of FIG. 3 comprises a mechanical switch 34, also labeled S2, which is coupled in series with semiconductor switch 33 as shown. A gate terminal of semiconductor switch 33 (i.e. a control terminal) and a control terminal of mechanical switch 34 is controlled by a controller 39 in the embodiment of FIG. 3.

In some embodiments, mechanical switch 34 is switched in a powerless manner. "Powerless" indicates that when mechanical switch 34 changes its state (open to close or vice versa), semiconductor switch 33 is open such that due to the series connection no current flows via mechanical switch 34. For example, starting from a closed state of switches 33, 34, first semiconductor switch 33 may be opened, followed by an opening of mechanical switch 34. Conversely, starting from an open state of switches 33, 34, in embodiments first mechanical switch 34 may be closed, followed by a closing of semiconductor switch 33.

In some embodiments, mechanical switch 34 provides redundancy to semiconductor switch 33. For example, mechanical switch 34 may provide a sure disconnection in case semiconductor switch 33 exhibits a fault.

It should be noted that for some safety critical applications, provision of a redundant switch like mechanical switch 34 may be required. In case of a mechanical switch like mechanical switch 34, such a mechanical switch may also provide a galvanic separation or an electrically protective separation.

While a semiconductor switch 33 and a mechanical switch 34 are shown in FIG. 3, other combinations of switches are also possible, as will be explained later with reference to FIGS. 4 and 5.

Numeral 35 designates a node, also labeled MP1, between semiconductor switch 33 and mechanical switch 34. In an example scenario, the switch device of FIG. 3 serves to couple a voltage source, for example a battery 30, selectively with a load to be coupled with terminals 31, 32 in FIG. 3. In some applications like applications where a DC voltage or current is to be switched (as shown in the example of FIG. 3), optionally a freewheeling diode 38 may be provided. In some embodiments, voltage supply 30 may for example be a supply battery in an automotive environment, for example a supply voltage driving an electromotor for driving an electric automobile, but is not limited to such applications.

In the example of FIG. 3, node 35 is coupled to voltage source 30 via a capacitance 37, also labeled C, and a resistor 36, also labeled $R_M$. Capacitance 37 represents an output capacitance of semiconductor switch 33, a capacitance of switch 34 and further parasitic capacitances. Additionally, a dedicated capacitor may be provided to increase the overall capacitance, which additional capacitor is also included in capacitance 37. For applications not required high switching frequencies, such an additional dedicated capacitance essentially does not adversely affect the behavior of the circuit, but may for example be used as a snubber capacitance to reduce voltage spikes.

Resistor 36 represents a measurement resistor which symbolically represents a voltage measurement at node 35. As at least on short time scales high voltage values may occur, resistor 36 need not be implemented as a single resistor, but may also be implemented as a voltage divider, for example resistive divider, or as a more complex measurement circuit, for example to reduce a voltage to be measured to lower values.

Next, operation of the embodiment of FIG. 3 to provide a diagnosis function for semiconductor switch 33 will be discussed.

First, a case where at the beginning switches 33, 34 are closed such that a load is connected with voltage source 30 will be discussed. To open the switch device, first semiconductor switch 33 is opened. At this point, essentially the complete voltage provided by voltage source 30 drops across semiconductor switch 33. With a slight delay, for example to wait for oscillations caused by the opening of switch 33 to decay and to ensure that mechanical switch 34 may be switched currentless, switch 34 is opened.

In the case of a functional mechanical contact of switch 34, a leakage current of semiconductor switch 33 is usually higher than a leakage current via switch 34. For example, a leakage current over switch 34 may be assumed to be essentially zero compared with a leakage current across switch 33.

Therefore, a potential (voltage value) at node 35 now will decay from its initial value (e.g. close to a positive supply voltage supplied by voltage source 30 in the example of FIG. 3) to a final value (for example at or near a negative supply voltage provided by voltage supply 30 in the embodiment of FIG. 3). The speed of this decay depends on leakage currents via transistor 33 (and on current via resistor 36 and capacitance 37). Resistor 36 usually is chosen to be very high, such that the decay may be dominated by the leakage current via transistor 33.

In case semiconductor switch 33 operates correctly, the leakage current will be low, such that the voltage at node 35 decays only slowly. A time constant of the decay is determined by capacitance 37 as the capacitance of node 35 to a reference potential (e.g. negative supply voltage supplied by voltage supply 30 in the example of FIG. 3) towards which the voltage at node 35 decays.

The leakage current across semiconductor switch 33 also depends on its temperature. Therefore, by evaluating a time constant of the voltage decrease after opening switches 33, 34, information about the leakage current across transistor 33 may be obtained. For example, the time constant may be compared with a reference time constant in some embodiments, and if the time constant falls below the reference time constant, this may indicate an overly high leakage current and therefore problems in switch 33, either due to over-temperature or other causes.

In case evaluating the time constant or otherwise evaluating the temporal behavior of the voltage results in an indication that a faulty condition may be present, a next closing of switches 33, 34 may be prevented, such that the switches remain open.

In some embodiments, such an evaluation of the time constant may be performed repeatedly. For example, if evaluation of the time constants indicates an error, node 35 may again be charged to the positive supply voltage, for example via an optional further high voltage switch 310. Additional switch 310 may for example be implemented as a mechanical switch or as a semiconductor switch. However, switch 310 is optional, and may be omitted in other embodiments.

A charging via switch 310 may be performed for example in regular intervals after the evaluation of the temporal behavior mentioned above has indicated that a fault condition may be present (for example if a time constant for the decay of the voltage at node 35 was lower than a reference value). After each charging of node 35 via switch 310, switch 310 is opened again, and essentially the same temporal evaluation as mentioned above may be performed. In case the detected fault condition was e.g. caused by over-temperature, the time constant of the decay then should become longer from measurement to measurement (i.e. from charging of node 35 via switch 310 to a next charging), as when switches 33, 34 are opened the temperature should drop.

In this way, a cooling of semiconductor switch 33, and if the time constant rises above a predetermined threshold value, this may indicate that the temperature has fallen far enough and switches 33, 34 may be closed again. Also, a speed of the temperature drop may be evaluated by evaluating how fast the time constant changes from measurement to measurement. If the time constant changes very little (for example difference between two successive measurements being below a predetermined threshold), this may for example indicate a fault in a cooling system or a load heat transfer between semiconductor switch 33 or relevant parts thereof to an environment. In this way, hidden or gradual faults as a deteriorating thermal contact between semiconductor switch 33 to a cooling body or a delamination of a chip comprising semiconductor switch 33 from a lead frame for example due to aging or load changes may be detected early, before a complete failure of the device.

Alternatively or additionally, a test procedure may be implemented in embodiments starting from a state where switches 33, 34 are opened. Prior to opening switches 33, 34, in an embodiment node 35 is charged to a voltage like a positive supply voltage via a high-ohmic resistor. As an example, a high-ohmic resistor 311 is illustrated in FIG. 3. While in the example of FIG. 3 high-ohmic resistor 311 is provided in the same path as switch 310, in other embodiments an additional path may be provided.

After this charging, for a test similar to the testing described above, switch 310 is opened, and transistor 33 remains open. In this case, as transistor 33 is open and should have low leakage currents, the voltage at node 35 should not drop too fast, and a drop faster (with a smaller time constant) than a threshold may indicate a fault.

In another testing, switch 310 may, if present, remain closed, and transistor 33 is closed. In this case, the voltage at node 35 should essentially drop to the negative supply voltage (also referred to as reference potential) supplied by voltage supply 30, as resistor 311 is high-ohmic (for example in the mega-Ohm range) and a resistance of semiconductor switch 33 in a closed state should be very low. Therefore, high-ohmic resistor 311 and semiconductor switch 33 essentially form a resistive divider, and if semiconductor switch 33 is closed and low-ohmic, a voltage at node 35 is close or at the negative supply voltage supplied by voltage source 33. In case, however, the voltage at node 35 remains above a threshold value, this may indicate a faulty opening of switch 33, i.e. switch 33 being higher-ohmic than intended. In such a case, a fault state may be recognized, and switch 33 may be opened again.

If no problem is detected, in some embodiments then switch 34 may be closed, and switch 310 subsequently may open, prior to closing switch 33.

In some embodiments, closing of switch 33 may be performed in a clocked manner, for example to pre-charge a load while avoiding an overly high inrush current. Such a clocked or repeated closing or opening of switch 33 may for example be helpful when switching on a light bulb, a load with a high input capacitance or similar loads which, while cool or while uncharged, have a low resistance and essentially correspond to a short circuit.

As already mentioned, while in FIG. 3 a semiconductor switch 33 and a mechanical switch 34 are provided, in other embodiments other implementations or combinations are possible. Furthermore, while in FIG. 3 switches 33, 34 are directly coupled in series, in other embodiments a load may be coupled between two switches. Examples for such configurations will now be discussed with reference to FIGS. 4 and 5.

Figure 4:
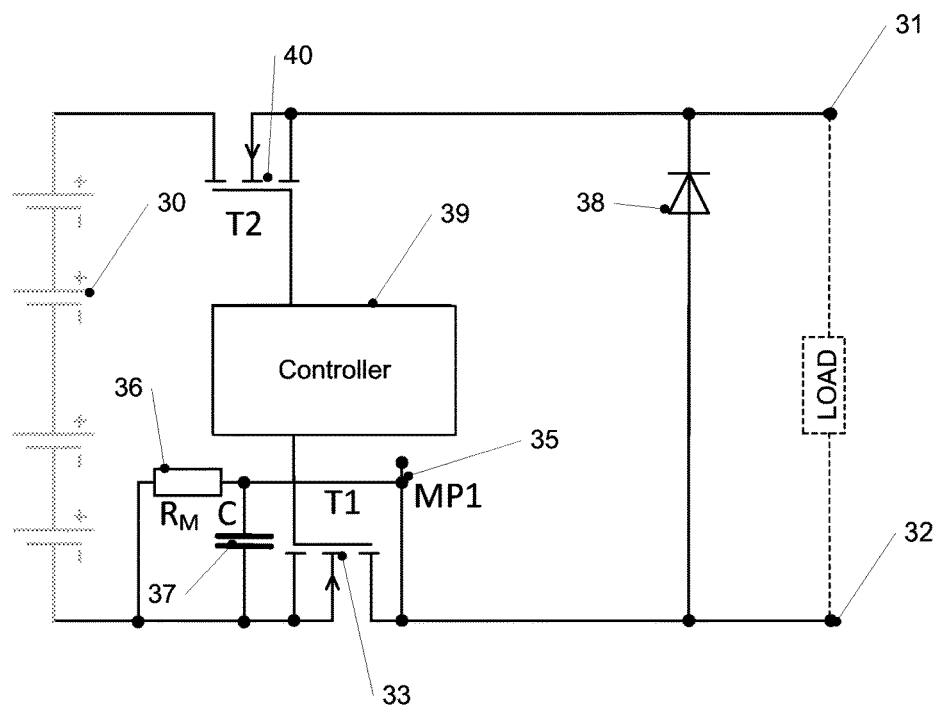
FIG. 4 illustrates a switch device according to a further embodiment.
Figure 5:
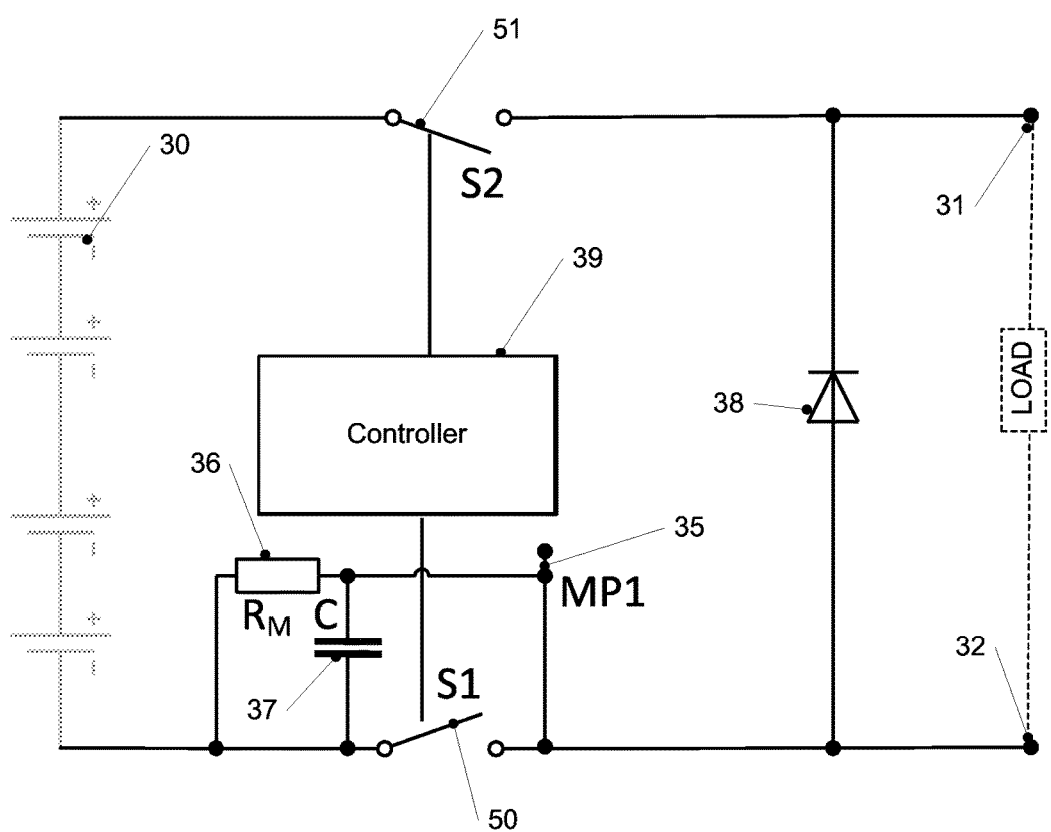
FIG. 5 illustrates a switch device according to an embodiment.

The embodiments of FIGS. 4 and 5 are based on the embodiment of FIG. 3. In order to avoid repetitions, like elements bear the same reference numerals and will not be described again in detail. Instead, essentially only differences compared with the embodiment of FIG. 3 will be discussed.

FIG. 4 illustrates an example where instead of mechanical switch 34 of FIG. 3 a further semiconductor switch 40 is provided. Furthermore, in the example of FIG. 4 a load (e.g. coupled between terminals 31, 32) is provided between switches 33, 40. Semiconductor switch 40 may be implemented as a further MOS transistor and is also labeled T2.

With semiconductor switches 33, 40 in some embodiments no galvanic separation as with a mechanical switch may be provided in some embodiment. The potential or voltage at node 35, in particular a temporal behavior thereof, may be monitored and evaluated as explained above with reference to FIG. 3.

To be able to monitor both semiconductor switches 33, 40, two paths like the path comprising resistor 311 and switch 310 may be provided in the embodiment of FIG. 4, one selectively coupling node 35 with the positive supply voltage (as shown in FIG. 3), and the other one coupling node 35 e.g. with the negative supply voltage provided by voltage supply 30. With this latter path, semiconductor switch 40 may be tested and monitored in a corresponding manner as described for semiconductor switch 33 with reference to FIG. 3.

In embodiments where both semiconductor switches 33, 40 are implemented in a similar manner (for example by using a same type of MOSFET), differences in the temporal behavior of the voltage at node 35 when testing switch 33 and when testing switch 40 may indicate differences between both transistors which may be an indication of aging or other faults in at least one of the transistors.

In other embodiments, only mechanical switches may be used. For example, in the embodiment of FIG. 5, compared to FIG. 4 semiconductor switches 33, 40 are replaced by mechanical switches 50, 51, respectively. Generally, an air gap for example in a relay contact or other mechanical switch represents a separation (in an open state of the switch) with a resistance of essentially infinity, with essentially no leakage currents. However, if such a relay contact is switched under load, due to an arc at each switching metal may evaporate from the contacts and may be deposited on an inner side of a housing. This metal "layer" on the housing may lower the isolation resistance of a relay or contactor. Therefore, the isolation resistance may decrease through such an aging effect. Such an aging may be monitored using an evaluation/testing of switches 50, 51 as discussed above. For some tests, current paths similar to the paths of FIG. 3 comprising resistor 311 and switch 310 may be provided.

As an example, in FIG. 5 switch 50 may be a working switch which first opens to decouple a load, while switch 51 is switched after this and therefore switched in a currentless manner. In such a scenario, switch 50 is prone to showing aging effects for example as described above, while switch 51 is not switched under load and therefore may exhibit less or no such aging effects. A monitoring of node 35 as discussed with reference to FIG. 3 may therefore monitor a condition of switch 50 and may for example enable a replacement, repair, service or the like prior to a failure of switch 50. In some embodiments, the sequence of switching the various switches shown and described on or off under load or without current may be altered between the switches, e.g. depending on the monitoring of node 35.

Figure 6:
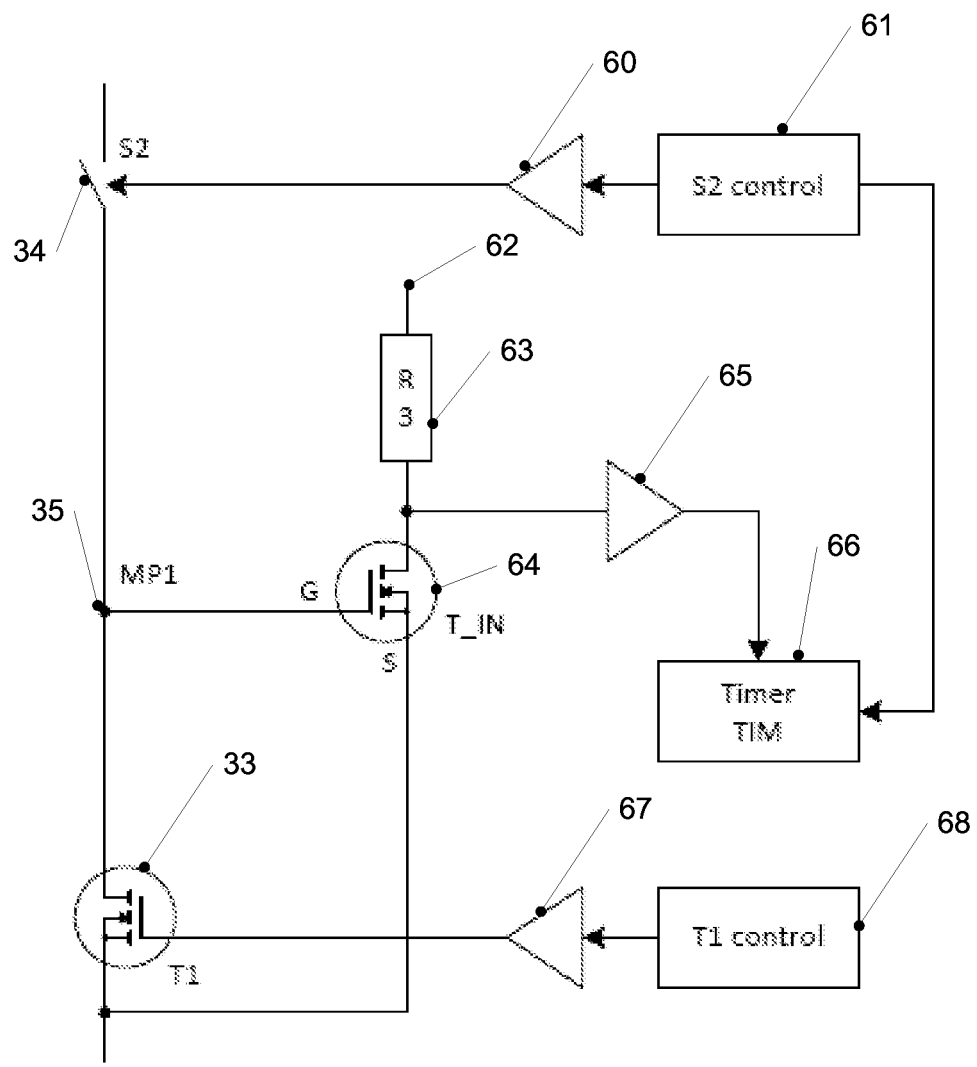
FIG. 6 illustrates an evaluation circuit according to an embodiment.

Various circuits may be used for monitoring the voltage at node 35, in particular a temporal behavior thereof. Such circuits may be integrated in controller 39 or may be implemented separately therefrom. An example circuit usable in some embodiments is shown in FIG. 6. The circuit of FIG. 6, however, serves only illustrative purposes, and other circuits may also be used. The circuit of FIG. 6 is illustrated using the example embodiment of FIG. 3 with semiconductor switch 33, mechanical switch 34 and a node 35 in between. However, the circuit of FIG. 6 is also applicable to other configurations, for example to the embodiments of FIGS. 4 and 5.

The circuit of FIG. 6 comprises a driver 67 driving a gate of semiconductor switch 33 controlled by a controller 68. In a similar manner, mechanical switch 34 is controlled by a signal from a driver 60 controlled by a controller 61. Drivers 60, 67 and controllers 61, 68 are an example for at least part of controller 39 of FIG. 3 controlling switches 33, 34.

Furthermore, the circuit of FIG. 6 comprises a measurement transistor 64, also labelled T_in. A gate terminal of transistor 64 is coupled with node 35 (MP1). A source terminal of transistor 64 is coupled with a source terminal of switch 33, which in the embodiment of FIG. 5 corresponds to a coupling with the negative supply voltage provided by voltage supply 30. A drain terminal of transistor 64 is coupled to a positive supply voltage 62 (for example 3.3 V in some implementation) via a resistor 63. In this embodiment, transistor 64 has to withstand the full blocking voltage of transistor 33 between the gate and source nodes of transistor 64. In another embodiment, the voltage at gate of transistor 64 may be limited to low values e. g. using a voltage divider or by other means.

Furthermore, the drain terminal of transistor 64 is coupled to a time measurement element 66 via an input stage 65, which may correspond to a standard input structure.

Capacitor 37 of FIG. 3 in the example of FIG. 6 is at least in part realized by a gate-source capacitance of transistor 64. Further contributions may exist for example due to parasitic capacitances. Transistor 64 in some embodiments may be implemented as a low-voltage transistor or as a high-voltage transistor, depending on a required drain-source voltage Vds of the transistor. In embodiments, a gate-source line of Transistor 64 has to withstand the blocking voltage between drain and source node of transistor 64. In some embodiments, a tolerated drain to source voltage of transistor 64 may be smaller than 30V, e. g. in the range of 3.3V to 5V while the tolerated gate source voltage of transistor 64 may be larger than 100V. Input stage 65 may for example be a low-voltage input of a controller like controller 39.

In embodiments, a high precision of a threshold for switching transistor 64 on and off is not needed, as a time needed between an opening of switch 34 and a switching off of transistor 64 due to discharging of a voltage across transistor 66 as described above in the embodiment shown is measured by a timer 66. In other words, timer 66 measures the above-mentioned time constant characterizing the temporal behavior of the voltage at node 35. In some implementation, this value may be measured under "good conditions", for example while the circuit is still cool at a beginning of operation and/or at an early stage of operation where no aging has occurred, and stored for example in controller 61 or any other storage provided. Controller 61 (which, as mentioned, may be part of controller 39 of FIG. 3) may then compare later values to values initially stored in a learning phase to detect an error condition. Furthermore, even if no such learning phase is used, a threshold deviation of transistor 64 may still not be critical, as even a threshold deviation of 30% around a nominal value for transistor 64 has less effect on the timing measurement by timer 66 than for example an exponential increase of a leakage current of transistor 33 with increasing temperature.

In embodiments, for example timer 66 may be started when controller 61 opens switch 34 after an opening of switch 33, and may be stopped when node 35 reaches a threshold value of transistor 64.

In some embodiments, using the gate-source capacitance of transistor 64 may result in lower leakage currents than using a standard high-voltage capacitor. Furthermore, using transistor 64 as measurement resistor may keep additional leakage currents caused by the measurement circuit low.

With this approach, as explained above timer 66 may measure a time characteristic of a decay of the voltage at node 35.

While a specific measurement circuit is shown in FIG. 6, this is not to be construed as limiting, and conventional approaches to measuring a temporal behavior of a voltage at node 35 may also be used.

The above-described embodiments serve only as examples and are not to be construed as limiting.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch device, comprising:
a first switch;
a second switch; and
an evaluation circuit configured to evaluate a temporal behavior of a node between the first switch and the second switch to detect a possible fault condition of at least one of the first switch or the second switch,
wherein the temporal behavior of the node comprises an information indicative of a rate or speed of change of a voltage at the node,
wherein the evaluation circuit comprises a measurement transistor, wherein a control terminal of the measurement transistor is coupled to the node.

2. The switch device of claim 1, further comprising a control circuit configured to, when the switch device is to be closed, first close the first switch and then close the second switch, and, when the switch device is to be opened, first open the second switch and then open the first switch.

3. The switch device of claim 2, wherein the evaluation circuit is configured to detect a possible fault condition of the first switch.

4. The switch device of claim 1, wherein the first switch comprises a semiconductor switch.

5. The switch device of claim 4, wherein the second switch comprises one of a semiconductor switch and a mechanical switch.

6. The switch device of claim 1, wherein the first switch comprises a mechanical switch, and wherein the second switch comprises a mechanical switch.

7. The switch device of claim 1, further comprising terminals configured to be coupled with a load between the first switch and the second switch.

8. The switch device of claim 1, wherein the evaluation circuit is configured to monitor the temporal behavior when starting from a state in which the first and second switches are closed, the first switch is then opened followed by an opening of the second switch.

9. The switch device of claim 1, further comprising a circuit path configured to selectively charge the node to a first voltage, wherein the evaluation circuit is configured to monitor a change of a voltage at the node from the first voltage to a second voltage.

10. The switch device of claim 9, wherein the path comprises a resistor having a higher resistance than a resistance of the first switch in a closed state.

11. The switch device of claim 1, further comprising a capacitance coupled between the node and a terminal of the first switch.

12. The switch device of claim 1, wherein a terminal of the transistor is coupled to a timer.

13. A fault detection method for a switch device having a first switch and a second switch, the method comprising:

Evaluating, by an evaluation circuit, a temporal behavior of a node between the first and second switches; and Determining, by the evaluation circuit, a possible fault condition of at least one of the first switch or the second switch based on the temporal behavior, placing the first and second switches in an open condition;

closing the first switch; and pre-charging the node to a positive voltage, wherein the temporal behavior of the node comprises an information indicative of a rate or speed of change of a voltage at the node, and wherein evaluating the temporal behavior comprises evaluating if the voltage at the node drops sufficiently to a second voltage after closing the first switch.

14. The method of claim 13, further comprising opening the first switch followed by opening the second switch prior to evaluating the temporal behavior.

15. The method of claim 13, further comprising charging the node to a first voltage prior to evaluating the temporal behavior, wherein the evaluating comprises evaluating a change of the voltage at the node to a second voltage.

16. The method of claim 13, further comprising providing a load between the first switch and the second switch.

17. The method of claim 16, further comprising:

coupling the load to a voltage supply by closing the first and second switches; and decoupling the load from the voltage supply by opening the first and second switches.

18. The method of claim 13, wherein evaluating the temporal behavior comprises controlling a timer to measure a time characteristic of a decay of the voltage at the node.

* * * * *